United States Patent [19]
Roisen et al.

[11] Patent Number: 5,234,861
[45] Date of Patent: Aug. 10, 1993

[54] METHOD FOR FORMING VARIABLE WIDTH ISOLATION STRUCTURES

[75] Inventors: Roger L. Roisen, Shorewood; Curtis H. Rahn, Plymouth; John B. Straight, Crystal; Michael S. Liu, Bloomington, all of Minn.

[73] Assignee: Honeywell Inc., Minneapolis, Minn.

[21] Appl. No.: 668,013

[22] Filed: Mar. 12, 1991

Related U.S. Application Data

[62] Division of Ser. No. 374,960, Jun. 30, 1989, Pat. No. 5,017,999.

[51] Int. Cl.$^5$ ............................................ H01L 21/76
[52] U.S. Cl. ........................................ 437/67; 437/89; 437/90
[58] Field of Search ............... 437/67, 68, 90, 89, 437/62, 24; 148/DIG. 85, DIG. 86, DIG. 26, DIG. 50

[56] References Cited

U.S. PATENT DOCUMENTS

| | | | |
|---|---|---|---|
| 3,717,514 | 2/1973 | Burgess | 148/175 |
| 4,400,411 | 8/1983 | Yuan et al. | 427/86 |
| 4,412,868 | 11/1983 | Brown | 148/1.5 |
| 4,454,646 | 6/1984 | Joy et al. | 29/576 |
| 4,470,062 | 9/1984 | Muramatsu | 357/50 |
| 4,473,598 | 9/1984 | Ephrath et al. | 427/86 |
| 4,487,639 | 12/1984 | Lam et al. | 148/175 |
| 4,507,158 | 3/1985 | Kamins et al. | 148/175 |
| 4,508,579 | 4/1985 | Goth et al. | 148/175 |
| 4,526,631 | 7/1985 | Silvestri et al. | 148/175 |
| 4,528,047 | 7/1985 | Beyer et al. | 148/175 |
| 4,547,793 | 10/1985 | Bergeron | 357/50 |
| 4,551,394 | 11/1985 | Betsch et al. | 428/641 |
| 4,556,585 | 12/1985 | Abernathy et al. | 437/67 |
| 4,575,925 | 3/1986 | Kanbara et al. | 29/576 |
| 4,578,143 | 3/1986 | Arai | 156/617 |
| 4,592,792 | 6/1986 | Corboy et al. | 148/175 |
| 4,636,281 | 1/1987 | Buiguez et al. | 156/643 |
| 4,663,831 | 5/1987 | Birrittella | 437/89 |
| 4,680,614 | 7/1987 | Beyer et al. | 357/50 |
| 4,688,069 | 8/1987 | Joy et al. | 357/34 |
| 4,689,656 | 8/1987 | Silvestri | 357/49 |
| 4,908,328 | 3/1990 | Hu et al. | 437/90 |
| 5,049,521 | 9/1991 | Belanger et al. | 437/62 |

FOREIGN PATENT DOCUMENTS

| | | | |
|---|---|---|---|
| 60-57964 | 4/1985 | Japan | 437/89 |
| 61-154121 | 7/1986 | Japan | 437/90 |
| 62-143442 | 6/1987 | Japan | 437/89 |
| 1214014 | 8/1989 | Japan | 437/90 |

OTHER PUBLICATIONS

Harame et al, Electrical Characteristics of Diodes Fabricated in Selective-Epitaxial Silicon Wells, Nov., 1986; from *Solid-State Electronics*, vol. 30, No. 9, pp. 907-912.

*Primary Examiner*—George Fourson
*Attorney, Agent, or Firm*—Gregory A. Bruns

[57] ABSTRACT

An isolation structure as well as a method for using and fabricating an isolation structure in an active layer deposited on a substrate the method of fabrication including the steps of forming a buried oxide layer in the active layer adjacent the substrate, forming an isolation trench in the active layer by etching at least up to and optionally into the substrate, forming a dielectric isolation layer on the exposed surfaces of the trench, removing the dielectric isolation layer from the bottom of the trench, and forming an isolation structure by epitaxially growing monocrystalline silicon in the trench.

42 Claims, 4 Drawing Sheets

METHOD FOR FORMING VARIABLE WIDTH ISOLATION STRUCTURES

This is a division of application Ser. No. 07/374,960, filed Jun. 30, 1989, now U.S. Pat. No. 5,017,999.

FIELD OF THE INVENTION

The present invention relates generally to semiconductor isolation structures and, more specifically, to the uniform epitaxial growth of monocrystalline silicon in isolation trenches having variable widths.

BACKGROUND OF THE INVENTION

Isolation structures are well known in the art as a means of electrically insulating active semiconductor devices which have been fabricated on the same substrate. In order to reduce device-to-device spacing, trench isolation structures have been proposed.

For example, U.S. Pat. No. 5,592,792 to Corboy et al discloses a method of fabricating a trench isolation structure. However, the resulting structure has a faceted upper surface which impedes further planar processing, planarization being important to the efficiency of producing miniaturized semiconductor structures. Moreover, the Corboy et al isolation device does not provide an effective means of complete isolation.

Certain inventors have addressed the problem of forming a planar isolation structure on a substrate containing multiple devices. For instance, U.S. Pat. No. 4,680,614, U.S. Pat. No. 4,528,047, U.S. Pat. No. 4,689,656 and U.S. Pat. No. 4,526,631, among others, address various aspects of producing isolation trenches having a planar upper surface. However, these patents teach complex fabrication methods which require cumbersome and expensive multi-step processing and result in multi-layered filling of the isolation trenches.

Consequently, a need exists for an isolation structure which can be formed simply, efficiently, and inexpensively and which effectively isolates the active devices between which the structure is fabricated.

SUMMARY OF THE INVENTION

The present invention addresses these problems by providing a method for fabricating an isolation structure in an active layer deposited on a substrate including forming a buried oxide layer in the active layer adjacent the substrate, forming an isolation trench in the active layer by etching at least up to and optionally into the substrate, forming a dielectric isolation layer on the exposed surfaces of the trench, removing the dielectric isolation layer from the bottom of the trench, and forming an isolation structure by epitaxially growing monocrystalline silicon in the trench.

A further aspect of the present invention is providing a semiconductor isolation device which includes a substrate, a monocrystalline silicon isolation structure overlying less than the entirety of the substrate, a buried oxide layer bordering the isolation structure and overlying the substrate adjacent the isolation structure, an active layer overlying the buried oxide layer, and a dielectric isolation layer lying intermediate between the active layer and the isolation structure.

An additional aspect of the present invention is a method of using the semiconductor isolation structure including the steps of affixing a biasing lead to the exposed side of the bulk substrate and, optionally, applying a voltage to the substrate.

BRIEF DESCRIPTION OF THE DRAWINGS

FIG. 7a depicts a partial cross-sectional view of an alternative embodiment of the semiconductor isolation structure of the present invention resulting from the processing depicted in FIGS. 1-3 and 4a-6a.

DETAILED DESCRIPTION OF THE PREFERRED EMBODIMENT

Figure 1:
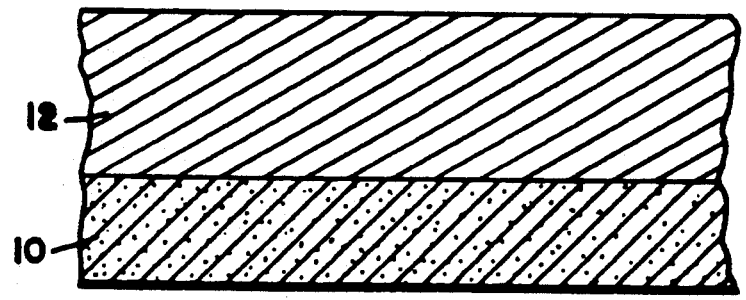
FIGS. 1-6 depict partial cross-sectional views at various stages in the production of a semiconductor isolation structure in accordance with the method of the present invention.

The present invention comprises a method for fabricating an isolation structure, the resulting isolation structure, and a method of using that isolation structure. The process comprises fabricating an isolation structure 24 in an active layer 12 deposited on a substrate 10 comprising the steps of forming a buried oxide layer 14 in an active silicon layer 12 which has been deposited on the substrate 10, forming an isolation trench 22 in the active layer, forming a dielectric isolation layer 26 on the exposed surfaces of the trench, removing the oxide from the bottom of the trench 22, and epitaxially growing monocrystalline silicon within the trench.

The process of the present invention may also be used to form and uniformly refill any number of trenches which have been positioned on the same substrates simultaneously. The low temperature epitaxial growth combined with the low system pressures in the growth chamber allow the uniform refill of multiple trenches where the trenches may or may not be of uniform dimension. Uniform refill of multiple variable width trenches is further enabled by use of an epitaxial growth process. Epitaxial growth of the monocrystalline isolation structure 24 results from the exposure of the upper surface 23 of the single crystal seed substrate 10.

Figure 2:
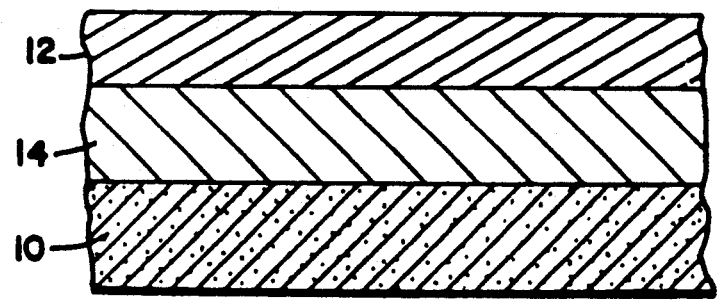

The first step in the process of the present invention is forming a buried oxide layer 14 in an active monocrystalline silicon layer 12 which overlies the substrate 10, FIGS. 1 and 2. Buried oxide layer 14 fulfills two related functions. First, the buried oxide layer joins with the dielectric isolation layers 26 in the completed structure to fully insulate the adjacent active semiconductor devices 12' and 12'', FIG. 6. The buried oxide layer 14 will later insulate any subsequently formed active devices from the voltage applied through lead 30 to the substrate 10. This voltage is applied to the entire substrate 10 and results in a bias of the isolation structure 24 due to the direct contact between the substrate 10 and the isolation structure 24.

In processing, the monocrystalline silicon active region 12 is implanted with oxygen. Once the oxygen implantation is completed, a high temperature anneal is performed, resulting in the buried oxide layer 14 adjacent the semiconductor substrate 10 with a thin layer of monocrystalline silicon remaining at the surface of the active silicon 12, FIG. 2.

After formation of the buried oxide layer 14 the structure may be subjected to an in situ $H_2$ cleaning at high temperature to remove native oxide formed on the surface of the active silicon layer 12. Generally, due to a limited ability to drive the buried oxide layer 14 only so far into the active silicon layer 12, an additional layer of intrinsically grown monocrystalline silicon may then be formed on the upper surface of the active silicon layer 12. Generally about 0.10 to 1.5 micron of silicon may be grown from $H_2$ and dichlorosilane source gases. The flow rates of these gases may vary depending on the desired uniformity and growth rate but will generally be about 0.15 to 0.4 liters/minute for the dichlorosilane and about 70 to 200 liters/minute for the $H_2$.

The next step in the process of the present invention is a formation of the isolation trench 22. The isolation trench will function as the site for the epitaxial growth of the isolation structure. Generally, an etch mask will be deposited over the surface of the active silicon 12. The etch mask functions to facilitate the formation of the isolation trench.

Figure 3:
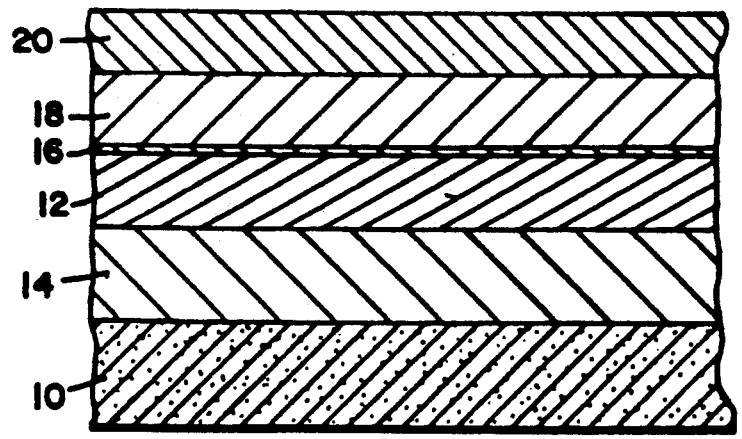

If used, the etch mask generally will take the formation or structure shown in FIG. 3. This etch mask results from the growth of a thin silicon oxide layer 16 on the upper surface of the active silicon 12. This thin silicon oxide mask will serve as a buffer or a pad for the next layer of the dielectric which is to be deposited upon the surface of the semiconductor. This thin oxide layer typically is formed to a thickness ranging from about 100 angstroms to about 500 angstroms and preferably about 300 angstroms. Generally, this layer is formed using wet $O_2$ processing at a temperature ranging from about 825° C. to about 950° C. and preferably 850° C.

A thicker silicon nitride layer 18 is then deposited over the initial silicon dioxide layer 16. The silicon nitride layer functions as an etch mask for the formation of the isolation trench 22 and as a LOCOS mask in finalizing the structure before further processing. Generally, the nitride layer 18 is deposited through chemical vapor deposition processes to a thickness ranging from about 1,500 angstroms to about 3,500 angstroms and preferably about 3,000 angstroms. The temperature at which the nitride layer is formed ranges from about 750° C. to about 950° C. and preferably is about 800° C. over a period of time which correlates directly with the thickness of the silicon nitride layer.

Optionally, an outer etch mask layer 20, FIG. 3, of silicon oxide is deposited on the intermediate silicon nitride layer 18 using conventional chemical vapor deposition techniques. This outer layer of silicon dioxide 20 serves as an etch mask protecting the intermediate nitride layer 18 from etching during the formation of the isolation trench 22. In practice, it is believed that some silicon reactive ion etches are difficult to make selective to silicon nitride. Use of the outer silicon oxide layer 20 in the three level etch mask allows deep trenches to be etched up to and into the substrate 10 and through the active silicon layer 12. Deep etching of the structure without damage to the silicon nitride layer 18 is possible because the selectivity of the etchant to the exterior silicon oxide layer 20 is much higher than the selectivity of the etchant to the covered silicon nitride layer 18. As a typical result, the silicon nitride masking layer 18 is retained for further processing while the outer silicon oxide masking layer 20 is used as the primary mask in forming the trenches 22.

The etch mask being the first silicon oxide layer 16, the intermediate silicon nitride layer 18 and the outer silicon oxide layer 20 typically is then patterned with a photo-resist and then etched using reactive ion etching processes. The photo-resist is then normally removed in preparation for forming the isolation trench.

Figure 4:
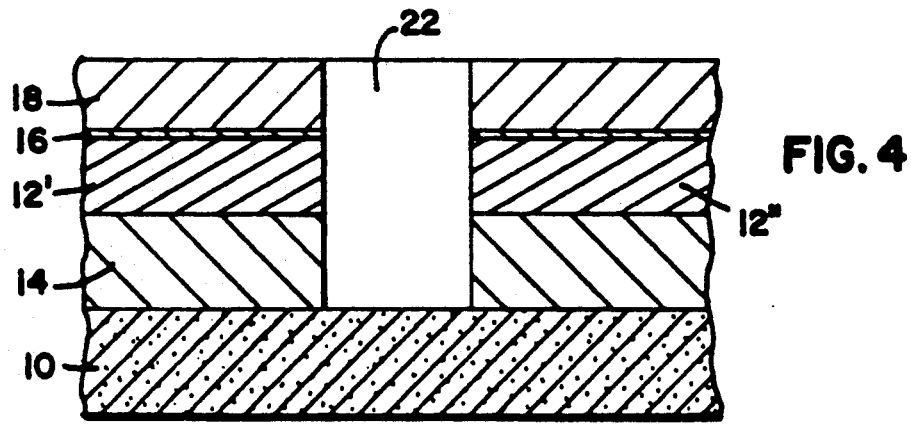

The isolation trench 22 may be formed by first etching through the active silicon layer 12 and buried oxide layer 14 up to the substrate 10 using reactive ion etching processes, FIG. 4. The presence of the buried oxide layer 14 allows the non-specific etching of the isolation trench 22 up to and even into the semiconductor substrate 10 while preventing latch up in any resulting devices formed in the silicon active layer 12.

The etchant used to form the isolation trench may be anisotropic or isotropic in nature. While isotropic etchants result in under cut areas in the isolation trench 22, the process of the present invention allows for filling the trench 22 with epitaxial monocrystalline silicon without the formation of void areas in the undercut regions of the trench 22.

The trench 22 depicted in FIG. 4 has been etched with an anisotropic etchant. Generally, the species of etchant used in the formation of the isolation trench may be selected from those well known in the art including various flourocarbon plasmas. At the same time that the isolation trench is formed, the upper layer of the etch mask being the outer silicon oxide layer 20 may be removed from the upper surface of the structure. The underlying intermediate layer of silicon nitride 18 may be left untouched as it is masked from the etchant by the outer silicon oxide layer 20, FIG. 4.

Figure 5:
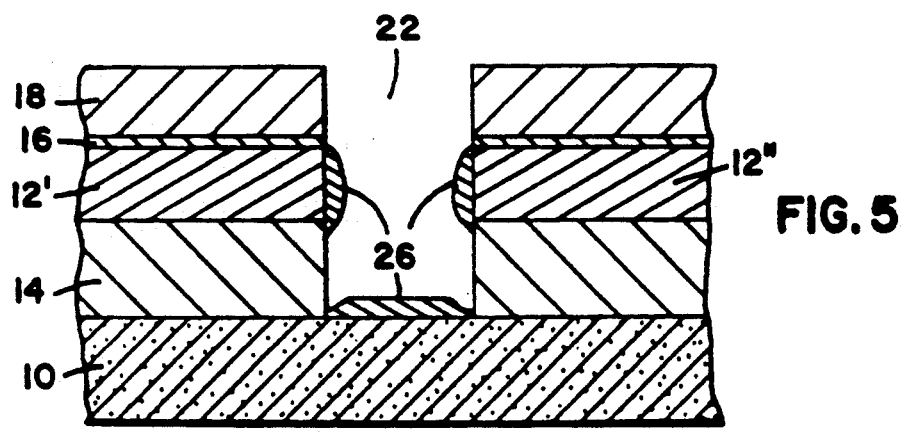

A dielectric isolation layer 26 may then be grown or deposited on the exposed surface of the trench, FIG. 5. This dielectric layer 26 forms on the exposed silicon surfaces and electrically isolates these active areas in either side of the isolation structure from the substrate, the trench, and from each other. Generally, the dielectric isolation layers are grown through wet $O_2$ processing which provides the formation of sidewall oxide and an adequate thickness of from about 200 angstroms to about 1,000 angstroms and preferably to a thickness of less than about 500 angstroms. The sidewall oxide is generally grown at a temperature ranging from about 825° C. to about 950° C. The exact growth time will vary depending on the growth temperature used and layer thickness desired.

The present invention allows the sidewall of the active areas 12' and 12" to be auto-doped by the diffusion of the ion impurity which may be deposited in situ during growth of the isolation structure 24 through the dielectric isolation layer 26 and into the active areas 12' and 12". This auto doping process is preferred because, as the thin sidewall oxide is grown, dopant from these active areas 12' and 12" segregated into the dielectric isolation layer 26 resulting in a depletion of the impurity necessary to the semiconductor active areas 12' and 12". The end result is an increase in the possibility of a small electric field inducing an inversion of carriers in the dopant depleted region. Such an inversion would possibly result in a leakage path along the sidewall of the isolation trench. The structure of the present invention alleviates these problems by auto-doping the active areas of the semiconductor substrate during the in situ doping of the isolation structure 24 as this structure is grown.

As will be seen, isolation structure 24 contains a conductive material, i.e., an ion impurity dopant, which allows for the backside bias of the isolation structure. This biasing, in turn, retards additional leakage along the sidewall of the trench and may increase transistor performance.

Figure 6:
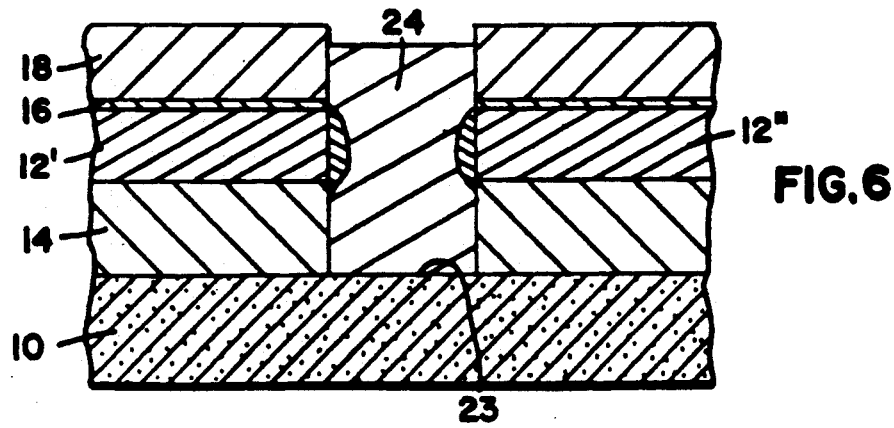

As can be seen in FIG. 6, the isolation structure 24 may then be grown after the excess oxide is removed from the base 23 of the semiconductor substrate exposing the monocrystalline surface of the seed substrate 10. Generally, the isolation structure is grown at a pressure ranging from about 20 to 100 torr at a temperature ranging from about 850° C. to about 950° C. in a chamber having a source gas flow of dichlorosilane ranging from about 0.15 to about 0.4 liters per minute, of HCl source gas ranging from about 0.4 to about 1.2 liters per minute, and a carrier gas such as $H_2$ flowing at a rate ranging from about 70 to 200 liters per minute and preferably 150 liters per minute.

During epitaxial growth of the isolation structure 24 a P-type dopant such as, for example, $BH_3$ or $B_2H_6$ may be introduced into the growth chamber resulting in an ion impurity concentration in the isolation structure 24 ranging from about $1 \times 10^{17}$ to about $1 \times 10^{19}$ cm$^{-3}$.

Figure 7:
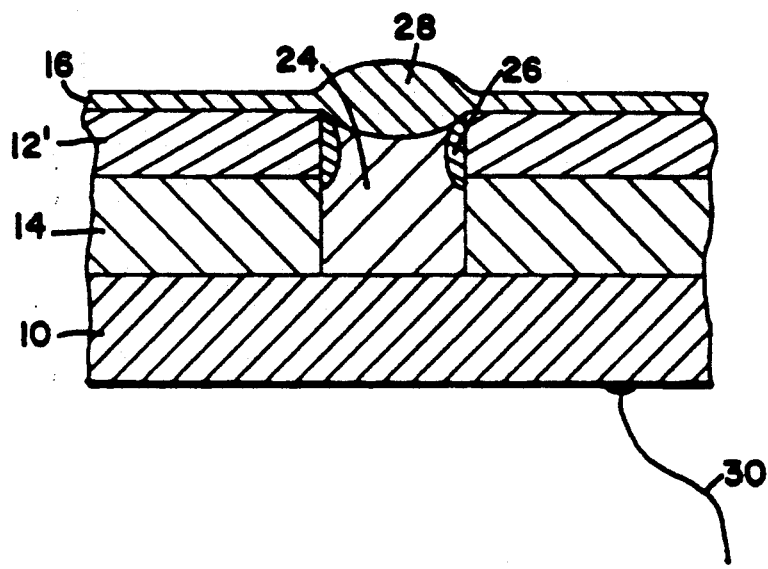
FIG. 7 depicts a partial cross-sectional view of one embodiment of the semiconductor isolation structure of the present invention resulting from the processing depicted in FIGS. 1-6.

In order to prepare the structure for further processing, a localized oxide cap 28 may be then formed across the surface of the isolation structure 24, as can be seen in FIG. 7. The remaining silicon nitride etch mask layer 18 serves as a LOCOS mask for the active areas of the semiconductor substrate. Oxide cap 28 can be used to function as an insulating island for subsequently formed active devices capable of functioning as an active insulator for live contacts between these devices. Generally, the oxide mask is grown to a thickness ranging from about 1,500 angstroms to about 4,000 angstroms and preferably about 2,000 angstroms. To prepare the semiconductor substrate for further processing, the silicon nitride layer 18 may be removed.

Finally a lead 30 may be attached to an exposed surface of the substrate 10, FIG. 7. As noted earlier, the biasing lead 30 may assist in improving the performance of the isolation structure of the present invention by reducing current leakage down the interface between the active areas 12' and 12" and the dielectric isolation layer 26. In order to affect the improved structure performance a voltage may be applied to the substrate 10 through lead 30. The placement of the lead 30 on the substrate 10 may be to any exposed or available surface. The buried oxide layer 14 isolates the active areas 12' and 12" from the voltage applied through lead 30. Moreover, the direct contact between the substrate 10 and the uninsulated isolation structure 24 will allow the structure 24 to be biased by the voltage.

In accordance with a preferred embodiment of the present invention, the isolation structure 24 of the present invention may be formed in an alternative sequence as seen in FIGS. 4a-7a.

Figure 4A:
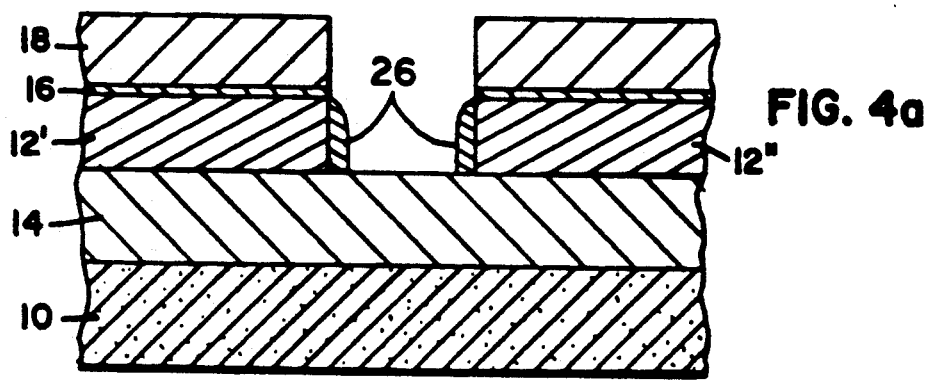
FIGS. 4a, 5a and 6a depict partial cross-sectional views of various stages the production of a semiconductor isolation structure in accordance with a preferred embodiment of the method of the present invention.

Once the etch mask has been formed and patterned at the upper surface of the semiconductor active substrate, the isolation trench may be formed by etching down through the surface of the active layer and up to the buried oxide layer 14, FIG. 4a. As depicted in FIGS. 4a-6a the trench 22 may be formed in batch processing by an instrument such as, for example, a model 8110 manufactured by Applied Materials Inc. with an anisotropic etchant such as $CHF_3$ combined with $O_2$ or any other flourocarbon plasma at a pressures of preferably less than 100 militorr and a bias of about 300 volts to about 1,000 volts. Alternatively, the etching may also be completed by single wafer etching. Use of an anisotropic etchant avoids the formation of undercut regions in the resulting trench such as those which may result from the use of isotropic etchants such as HF.

The dielectric isolation layer 26 may then be grown on the exposed surfaces of the silicon active layer 12' and 12". This dielectric isolation layer may be grown through processes substantially similar to those disclosed with the growth of the dielectric isolation layer in the previous embodiment. Also similar to the previous embodiment, the dielectric isolation layer 26 typically covers the bottom of the isolation trench 22, which in this case is the upper surface of the buried oxide layer 14. However, as will be seen, there normally is no need to remove this layer of the dielectric isolation material from the bottom of the trench, as the structure will be subjected to continued etching.

Figure 5A:
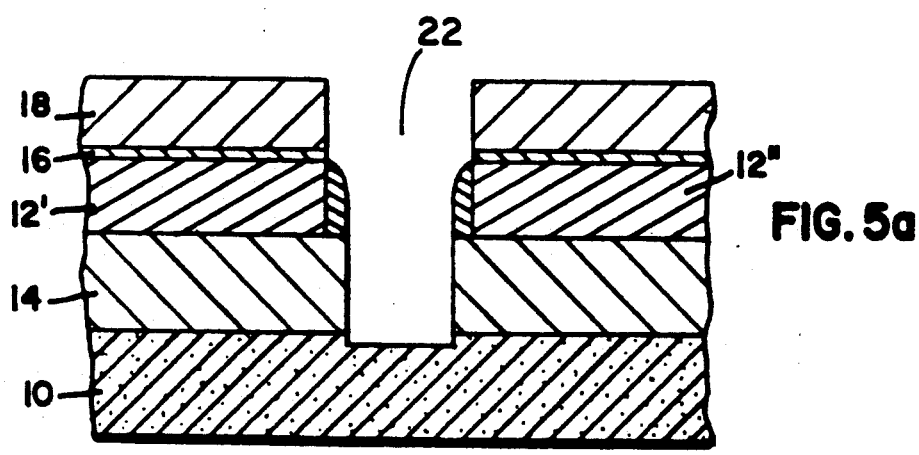
Figure 6A:
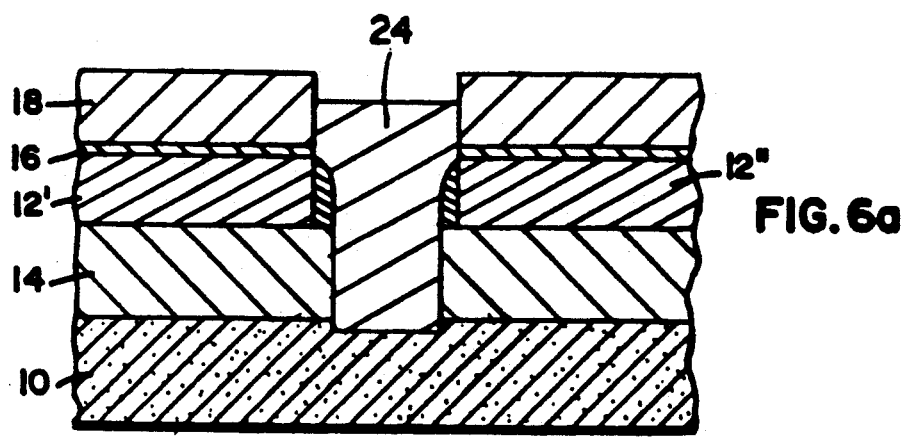

The formation of isolation trench 22 is then continued by etching additionally through the buried oxide layer 14 up to and optionally into the substrate 10, FIG. 5a. This two part etching of the isolation trench 22 provides for the formation of the dielectric isolation layer 26 on the vertical sidewalls of the silicon active layers 12' and 12" exposed by the etching of the trench. Also this preferred embodiment of the present process obviates any need to remove the dielectric isolation material which is formed on the base of the trench after the formation of the dielectric isolation layer 26, FIG. 4a.

Moreover, the etching processes of the present invention do not require the strict etching tolerances of the prior art and allow for the etching of the isolation trench into the substrate 10. Specifically, the presence of the buried oxide layer 14 in addition to the epitaxial growth of the isolation structure 24 directly from the substrate 10 allows for overetching the trench by as much as about 750 angstroms. In fact, given the desirability of biasing the isolation structure 24 a contact ensuring overetch of the substrate 10 is preferred in contrast to an underetch which may leave oxide on the upper surface 23 of the substrate 10.

Once the isolation trench has been formed through the process as disclosed before, the trench may be refilled with epitaxially grown monocrystalline silicon as with the previous embodiment. The structure may then be finalized with the formation of a localized oxide mask 28 at the upper surface of the refilled trench.

Similar to the previous embodiment, the monocrystalline silicon isolation structure 26 typically is epitaxially grown in the presence of an ion impurity such as boron which dopes the resulting isolation structure. Also, due to the preferred thickness of the dielectric isolation layer 26 formed on the sidewalls of the isolation trench 22, this ion impurity auto dopes these dielectric isolation layers and the adjacent layers of the silicon active layer 12.

Figure 7A:
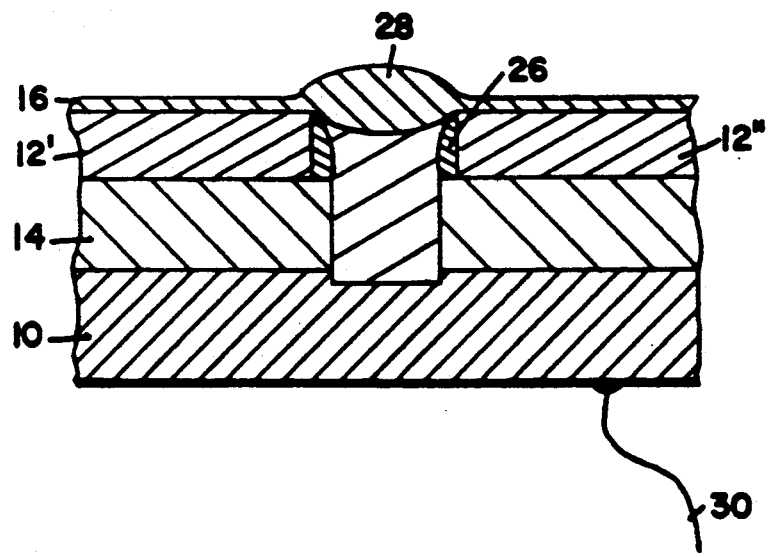

In operation, a biasing lead 30 may then be attached to the exposed base of the semiconductor device substrate 10, FIG. 7a. A voltage is then applied to the lead 30.

The doping of the isolation structure in concert with the backside biasing of the semiconductor structure effectively prevents the formation of a leakage path along the sidewalls between the active layer and the dielectric isolation layer. Furthermore, the latch up condition that occurs in conventional LOCOS trench isolation is completely nonexistent with the current invention. The active devices are completely isolated by the isolation structure grown in the trench.

The position of the lead on the substrate 10 is noncritical as the biasing voltage is focused on the isolation structure 24 through the buried oxide layer 14. Other than the buried oxide layer 14, the doped isolation structure 24 is the only surface exposed to the substrate 10.

We claim:

1. A method for fabricating an isolation structure in an active layer deposited on a substrate comprising the steps of:
   (a) forming a buried oxide layer in the active layer adjacent the substrate;
   (b) forming an isolation trench in the active layer by etching through the buried oxide layer at least up to the substrate;
   (c) forming a dielectric isolation layer on the exposed surfaces of the trench;
   (d) removing the dielectric isolation layer from bottom of the trench; and
   (e) forming an isolation structure by epitaxially growing monocrystalline silicon in the trench.

2. The method of claim 1 wherein said step of epitaxially growing monocrystalline silicon forms a refilled trench having an upper surface and additionally comprising a step of forming a dielectric cap across the upper surface of the refilled trench.

3. The method of claim 1 wherein the dielectric isolation layer has a thickness of from about 200 angstroms to about 1,000 angstroms.

4. The method of claim 1 wherein the dielectric isolation layer has a thickness of less than about 500 angstroms.

5. The method of claim 1 wherein multiple isolation trenches are formed at least up to the substrate, the trenches being filled to have uniform levels of epitaxially grown monocrystalline silicon.

6. The method of claim 1 wherein the step of forming the isolation structure comprises epitaxially growing the isolation structure at a temperature ranging from about 850° C. to 950° C.

7. The method of claim 1 wherein the step of forming the isolation structure comprises flowing an HCl source gas ranging from about 0.4 to 1.2 liters/minute, flowing an $H_2$ carrier gas at a rate ranging from about 70.0 to 200.0 liters/minute, and flowing an $H_2Cl_2Si$ source gas at a rate ranging from about 0.15 to 0.4 liters per minute.

8. The method of claim 1 wherein the step forming an isolation structure comprises forming an ion impurity region in situ in the isolation structure during growth 9. The method of claim 8 wherein the step of forming the impurity region in the isolation structure comprises forming an ion impurity region with a P-type dopant.

10. The method of claim 8 wherein the step of forming the impurity region in the isolation structure comprises forming an ion impurity region with a resulting impurity concentration ranging from $1 \times 10^{17}$ to $1 \times 10^{19}$ $cm^{-3}$.

11. The method of claim 1 further comprising the step of affixing a biasing lead to the substrate.

12. A method for fabricating an isolation structure in an active layer deposited on a substrate comprising the steps of:
   (a) forming a buried oxide layer in the active layer adjacent the substrate
   (b) forming an isolation trench in the active layer by etching at least up to the buried oxide;
   (c) forming a dielectric isolation layer on the exposed surfaces of the trench;
   (d) continuing the isolation trench by etching at least up to the substrate; and
   (e) forming an isolation structure by epitaxially growing monocrystalline silicon in the trench.

13. The method of claim 12 additionally comprising a step of forming a dielectric cap across the upper surface of the refilled trench.

14. The method of claim 12 wherein the step of forming the dielectric isolation layer comprises forming a layer having a thickness of from about 200 angstroms to about 1,000 angstroms.

15. The method of claim 12 wherein the step of forming the dielectric isolation layer comprises forming a layer to a thickness of less than about 500 angstroms.

16. The method of claim 12 wherein multiple isolation trenches are formed up to the substrate, the trenches being filled to have uniform levels of epitaxially grown monocrystalline silicon.

17. The method of claim 12 wherein the step of forming the isolation structure comprises epitaxially growing the structure at a temperature ranging from about 850° C. to 950° C.

18. The method of claim 12 wherein the step of forming the isolation structure comprises flowing an HCl source gas at a rate ranging from about 0.4 to 1.2 liters/minute, flowing an $H_2$ carrier gas at a rate ranging from about 70 to 200 liters/minute, and the flowing an $H_2Cl_2Si$ source gas at a rate ranging from about 0.15 to 0.4 liters per minute.

19. The method of claim 18 wherein the step of forming an isolation structure comprises forming an ion impurity region in situ in the isolation structure during growth.

20. The method of claim 18 wherein the step of forming the impurity region in the isolation structure comprises forming an ion impurity with a P-type dopant.

21. The method of claim 19 wherein the step of forming the impurity region in the isolation structure comprises forming ion impurity region with a resulting impurity concentration ranging from $1 \times 10^{17}$ to $1 \times 10^{19}$ $cm^{-3}$.

22. The method of claim 12 further comprising the step of affixing a biasing lead to the substrate.

23. A method for fabricating multiple isolation structures in an active layer deposited on a substrate comprising the steps of:
   (a) forming a buried oxide layer in the active layer adjacent the substrate;
   (b) forming multiple isolation trenches having different widths in the active layer by etching each trench through the buried oxide layer at least up to the substrate;
   (c) forming a dielectric isolation layer on the exposed surfaces of each variable width trench;
   (d) removing the dielectric isolation layer from the bottom of each of the trenches; and
   (e) forming an isolation structure in each of the multiple different width trenches by epitaxially growing monocrystalline silicon in the trenches.

24. The method of claim 23 wherein said step of epitaxially growing monocrystalline silicon forms refilled trenches having upper surfaces and additionally comprising a step of forming a dielectric cap across the upper surfaces of the refilled trenches.

25. The method of claim 23 wherein the step of forming the dielectric isolation layer comprises forming a layer having a thickness of from about 200 angstroms to 1,000 angstroms.

26. The method of claim 23 wherein the step of forming the dielectric isolation layer comprises forming a layer to a thickness less than about 500 angstroms.

27. The method of claim 23 wherein the step of forming the isolation structure comprises epitaxially growing the isolation structure at a temperature ranging from about 850° C. to 950° C.

28. The method of claim 23 wherein the step of forming the isolation structure comprises flowing an HCl source gas ranging from about 0.4 to 1.2 liters/minute, flowing an $H_2$ carrier gas at a rate ranging from about 70 to 200 liters/minute, and flowing an $H_2Cl_2Si$ source gas at a rate ranging from about 0.15 to 0.4 liters per minute.

29. The method of claim 23 wherein the step forming an isolation structure comprises forming an ion impurity region in situ in each isolation structure during growth.

30. The method of claim 28 wherein the step of forming the impurity region in the isolation structure comprises forming an ion impurity region with a P-type dopant in each isolation structure.

31. The method of claim 29 wherein the step of forming the impurity region in the isolation structure comprises forming an ion impurity region with a resulting impurity concentration ranging from $1 \times 10^{17}$ to $1 \times 10^{19}$ $cm^{-3}$ in each isolation structure.

32. The method of claim 23 further comprising the step of affixing a biasing lead to the substrate.

33. A method for fabricating multiple variable width isolation trenches in an active layer deposited on a substrate comprising the steps of:
 (a) forming a buried oxide layer in the active layer adjacent to substrate;
 (b) forming multiple isolation trenches having variable widths in the active layer by etching at least up to the buried oxide;
 (c) forming a dielectric isolation layer on the exposed surfaces of each variable width trench;
 (d) continuing each of the isolation trenches by etching at least up to the substrate; and
 (e) forming multiple isolation structures by epitaxially growing monocrystalline silicon in each of the variable width trenches.

34. The method of claim 33 additionally comprising a step of forming a dielectric cap across the upper surface of the refilled trench.

35. The method of claim 33 wherein the step of forming the dielectric isolation layer comprises forming a layer having a thickness of from about 200 angstroms to about 1,000 angstroms.

36. The method of claim 33 wherein the step of forming the dielectric isolation layer comprises forming a layer to a thickness of less than about 500 angstroms.

37. The method of claim 33 wherein the step of forming the isolation structure comprises epitaxially growing the structure at a temperature ranging from about 850° C. to 950° C.

38. The method of claim 33 wherein the step of forming the isolation structure comprises flow an HCl source gas at a rate ranging from about 0.4 to 1.2 liters/minute, flowing an $H_2$ carrier gas at a rate ranging from about 70 to 200 liters/minute, and the flowing an $H_2Cl_2Si$ source gas at a rate ranging from about 0.15 to 0.4 liters per minute.

39. The method of claim 33 wherein the step of forming an isolation structure comprises forming an ion impurity region in situ in each isolation structure during growth.

40. The method of claim 38 wherein the step of forming the impurity region in the isolation structure comprises forming an ion impurity with a P-type dopant in each isolation structure.

41. The method of claim 39 wherein the step of forming the impurity region in the isolation structure comprises forming ion impurity region with a resulting impurity concentration ranging from $1 \times 10^{17}$ to $1 \times 10^{19}$ $cm^{-3}$ in each isolation structure.

42. The method of claim 33 further comprising the step of affixing a biasing lead to the substrate.

* * * * *